United States Patent
Chien et al.

(10) Patent No.: US 7,489,037 B2
(45) Date of Patent: Feb. 10, 2009

(54) SEMICONDUCTOR DEVICE AND FABRICATION METHOD THEREOF

(75) Inventors: Feng-Lung Chien, Taiwan (CN); Chao-Dung Suo, Taiwan (CN); Yi-Hsin Chen, Taiwan (CN)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 11/373,693

(22) Filed: Mar. 10, 2006

(65) Prior Publication Data

US 2006/0226542 A1  Oct. 12, 2006

(30) Foreign Application Priority Data

Apr. 11, 2005 (TW) .............. 94111288 A

(51) Int. Cl.
H01L 23/48 (2006.01)
H01L 21/44 (2006.01)

(52) U.S. Cl. .............. 257/737; 257/750; 257/780; 257/E23.021; 257/E21.508; 438/612; 438/613

(58) Field of Classification Search .............. 257/737, 257/738, 780, E23.021, 750, E21.507, E21.508; 438/612–614
See application file for complete search history.

(56) References Cited

U.S. PATENT DOCUMENTS

| | | | |
|---|---|---|---|
| 6,656,826 B2* | 12/2003 | Ishimaru | 438/612 |
| 7,091,121 B2* | 8/2006 | Horng | 438/612 |
| 7,223,683 B2* | 5/2007 | Lin | 438/613 |
| 2003/0153172 A1* | 8/2003 | Yajima et al. | 438/612 |
| 2004/0266163 A1* | 12/2004 | Horng | 438/614 |
| 2006/0019480 A1* | 1/2006 | Cheng et al. | 438/612 |
| 2006/0073693 A1* | 4/2006 | Huang | 438/613 |

FOREIGN PATENT DOCUMENTS

TW  543125  5/1991

* cited by examiner

Primary Examiner—Tuan N. Quach
(74) Attorney, Agent, or Firm—Peter F. Corless; Steven M. Jensen; Edwards Angell Palmer & Dodge LLP

(57) ABSTRACT

A semiconductor device and a fabrication method thereof are proposed. A first dielectric layer is formed on a semiconductor substrate having at least one bond pad, wherein the first dielectric layer has a first opening for exposing the bond pad and a second opening at a predetermined position for redistribution. A first metallic layer is applied on the first dielectric layer and in the first and second openings. A second metallic layer and a third metallic layer are formed on the first metallic layer at positions corresponding to the first and second openings, respectively. A second dielectric layer and a solder bump are formed on the second and third metallic layers, respectively. The second metallic layer can assure electrical quality of the first metallic layer corresponding to the first opening without having an electrical break of the first metallic layer for redistribution.

14 Claims, 4 Drawing Sheets

SEMICONDUCTOR DEVICE AND FABRICATION METHOD THEREOF

FIELD OF THE INVENTION

The present invention relates to semiconductor devices and fabrication methods thereof, and more particularly, to a semiconductor device for preventing an electrical break of a metallic layer for redistribution, and a method of fabricating the semiconductor device.

BACKGROUND OF THE INVENTION

The progress of semiconductor fabrication technology and the upgrade of electrical functionality of chips contribute to the development of semiconductor devices having small IC (integrated circuit) area and high density of contacts, such as ball grid array (BGA) package, flip-chip package, chip size package (CSP) and so on, which are widely applied in portable electronic devices.

For flip-chip packaging technology, normally solder bumps are formed on contacts (e.g. bond pads) of a semiconductor substrate such as a wafer or chip, and the semiconductor substrate is electrically connected to a carrier such as a substrate via the solder bumps. The flip-chip technology advantageously provides a shorter circuit path and better electrical quality as compared to a conventional wire-bonding method. In the flip-chip package structure, the chip may further have an exposed back side, thereby improving heat dissipating efficiency of the chip.

Further, a UBM (under bump metallurgy) structure is formed on the bond pads of the chip before mounting the solder bumps on the bond pads, in order to firmly bond the solder bumps to the chip via the UBM structure. However, due to profile miniaturization and high integration of the chip, a pitch between the adjacent bond pads of the chip is reduced to be smaller than the size of the solder bumps, which makes the adjacent solder bumps come into contact with each other. Such problem can be solved by RDL (redistribution layer) technology as disclosed in Taiwanese Patent No. 543125 and U.S. Pat. No. 6,455,408, etc. The RDL technology utilizes conductive circuits to redistribute the bond pads located around the chip to proper positions and then forms the UBM structure on the redistributed positions of the bond pads so as to provide a suitable pitch between the adjacent solder bumps.

FIGS. 1A to 1C show steps of a conventional redistribution process of a semiconductor device. As shown in FIG. 1A, a semiconductor substrate 10 having at least one bond pad (i.e. I/O contact) 15 is provided. A passivation layer 20 and a first dielectric layer 21 are successively formed on a surface of the semiconductor substrate 10. Next, a photoresist layer 22 having a photoresist pattern is applied on the first dielectric layer 21, and serves as a mask to define the first dielectric layer 21 and form at least one opening 23 for exposing a portion of the bond pad 15. Then, the photoresist layer 22 is removed. As shown in FIG. 1B, a first metallic layer 26 for redistribution and a second metallic layer 27 are successively formed by sputtering on the first dielectric layer 21 and in the opening 23. As shown FIG. 1C, the second metallic layer 27 is removed by etching except a predetermined redistribution area thereof that forms a UBM structure 29, and a second dielectric layer 28 is applied on the first metallic layer 26 without covering the UBM structure 29. Finally, a solder bump 31 is formed on the UBM structure 29. This completes the redistribution process for the bond pad 15.

In the above redistribution process, generally the first metallic layer 26 comprises successive laminated layers of aluminum, nickel-vanadium alloy, copper and titanium, and the second metallic layer 27 comprises successive laminated layers of aluminum, nickel-vanadium alloy and copper. During the process of etching the second metallic layer 27, as the first metallic layer 26 does not have a satisfactory step coverage effect in the opening 23, the etchant may easily penetrate the titanium layer and damage the aluminum, nickel-vanadium alloy and copper layers of the first metallic layer 26, thereby causing an electrical break of the first metallic layer 26.

When the above redistribution process is applied to a chip having a fine pitch (hereinafter referred to as "fine-pitch chip") such as a high-speed analog product, the thickness of the first dielectric layer 21 is usually increased to reduce signal interference and thereby alters the aspect ratio of the opening 23. This not only deteriorates the step coverage effect of the first metallic layer 26 on a bottom portion of a sidewall of the opening 23, but also makes the thickness of the first metallic layer 26 on the bottom portion of the sidewall of the opening 23 reduced due to an isotropic effect of the etching process as shown in FIG. 1C, thereby easily causing the electrical break of the first metallic layer 26. Alternatively, the sidewall of the opening 23 can be slanted, which however needs an additional spacer to protect the sidewall and undesirably increases the difficulty in fabrication. Further, a slant angle of the slanted sidewall of the opening 23 has a limitation of about 65 degrees relative to a horizontal plane. If the slant angle is made smaller than 65 degrees, etching control would be hardly achieved during the process of forming the spacer.

Therefore, the problem to be solved here is to provide a semiconductor device and a fabrication method thereof, which can prevent an electrical break of a metallic layer for redistribution and can be applied to a fine-pitch chip so as to overcome the foregoing drawbacks of the prior art.

SUMMARY OF THE INVENTION

In light of the foregoing drawbacks in the prior art, an objective of the present invention is to provide a semiconductor device and a fabrication method thereof, which can avoid an electrical break of a metallic layer for redistribution.

Another objective of the present invention is to provide a semiconductor device and a fabrication method thereof, which can be applied to a fine-pitch chip.

In order to achieve the above and other objectives, the present invention proposes a semiconductor device comprising: a semiconductor substrate having at least one bond pad; a first dielectric layer formed on the semiconductor substrate, wherein the first dielectric layer has a first opening for exposing the bond pad and a second opening at a predetermined position for redistribution; a first metallic layer formed on the first dielectric layer and in the first and second openings; a second metallic layer and a third metallic layer, which are formed on the first metallic layer at positions corresponding to the first opening and the second opening, respectively; a second dielectric layer applied on the first metallic layer and the second metallic layer corresponding to the first opening, wherein the third metallic layer corresponding to the second opening is exposed from the second dielectric layer; and a solder bump formed on the third metallic layer.

The present invention also proposes a fabrication method of the semiconductor device, comprising the steps of: providing a semiconductor substrate having at least one bond pad; forming a first dielectric layer on the semiconductor substrate, wherein the first dielectric layer has a first opening for exposing the bond pad and a second opening at a predetermined position for redistribution; forming a first metallic layer on the first dielectric layer and in the first and second openings; forming a second metallic layer and a third metallic layer on the first metallic layer at positions corresponding to the first opening and the second opening, respectively; applying a second dielectric layer on the first metallic layer and the second metallic layer corresponding to the first opening, wherein the third metallic layer corresponding to the second opening is exposed from the second dielectric layer; and forming a solder bump on the third metallic layer.

In the above semiconductor device and fabrication method of the present invention, the semiconductor substrate can be a semiconductor chip, and is preferably a wafer including a plurality of chips.

Each of the first and second dielectric layers can be made of benzo-cyclo-butene (BCB), polyimide or silicon dioxide. The first metallic layer comprises successive laminated layers of aluminum, nickel-vanadium alloy, copper or titanium. Each of the second and third metallic layers can be made of nickel-vanadium alloy or copper.

A passivation layer may further be provided between the semiconductor substrate and the first dielectric layer. Preferably, the passivation layer is a silicon mononitride layer.

The second and third metallic layers further cover the first metallic layer located on sidewalls of the first and second openings, respectively. The second and third metallic layers are separate from each other.

The present invention further proposes another semiconductor device comprising: a semiconductor substrate having at least one bond pad; a first dielectric layer formed on the semiconductor substrate and having an opening for exposing the bond pad; a first metallic layer formed on the first dielectric layer and in the opening; a second metallic layer and a third metallic layer, which are formed on the first metallic layer at a position corresponding to the opening and at a predetermined position for redistribution, respectively; a second dielectric layer applied on the first metallic layer and the second metallic layer corresponding to the opening, wherein the third metallic layer at the predetermined position for redistribution is exposed from the second dielectric layer; and a solder bump formed on the third metallic layer.

The present invention also proposes a fabrication method of the above semiconductor device, comprising the steps of: providing a semiconductor substrate having at least one bond pad; forming a first dielectric layer on the semiconductor substrate, the first dielectric layer having an opening for exposing the bond pad; forming a first metallic layer on the first dielectric layer and in the opening; forming a second metallic layer and a third metallic layer on the first metallic layer at a position corresponding to the opening and at a predetermined position for redistribution, respectively; applying a second dielectric layer on the first metallic layer and the second metallic layer corresponding to the opening, wherein the third opening at the predetermined position for redistribution is exposed from the second dielectric layer; and forming a solder bump on the third metallic layer.

According to the semiconductor device and the fabrication method thereof in the present invention, the second metallic layer covers the first metallic layer at a position corresponding to the opening where the bond pad is exposed, such that electrical quality of the first metallic layer for redistribution can be assured without having an electrical break of the first metallic layer, thereby avoiding the prior-art drawback such as damage to a metallic layer for redistribution due to an etching process. Moreover, the present invention can prevent deterioration of a step coverage effect due to a change of an aspect ratio of the opening to thereby effectively avoid the electrical break of the first metallic layer, such that the present invention is suitably applied to a fine-pitch chip.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Embodiment

Figure 1A:
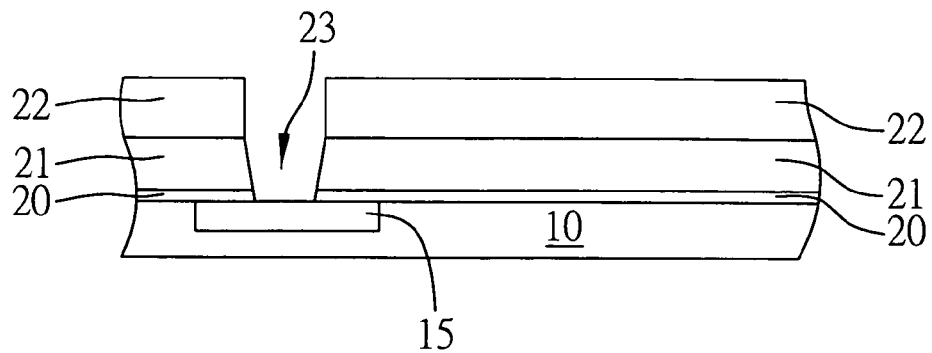
FIGS. 1A to 1C (PRIOR ART) are schematic diagrams showing steps of a conventional redistribution process of a semiconductor device.
Figure 1B:
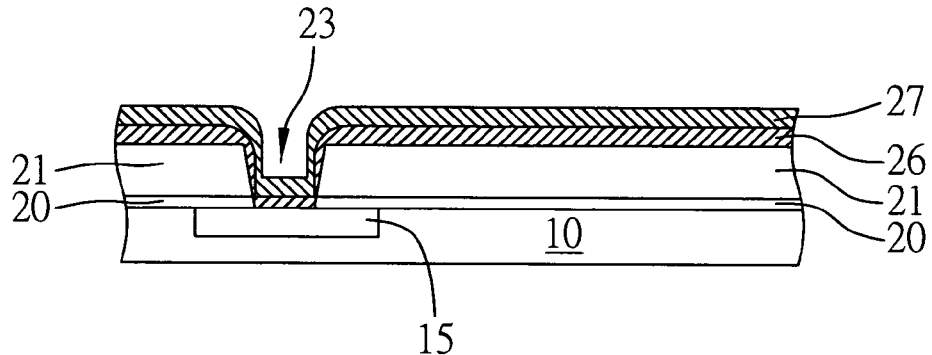
Figure 1C:
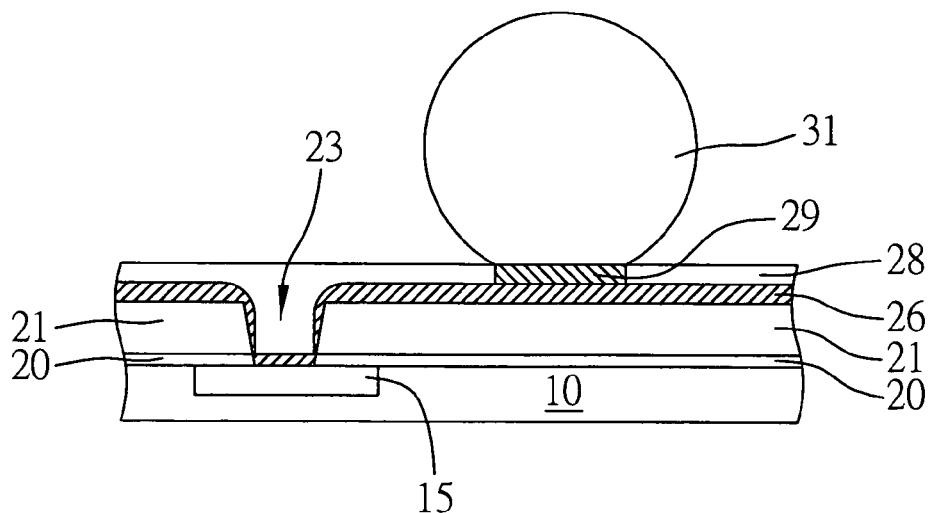
Figure 2A:
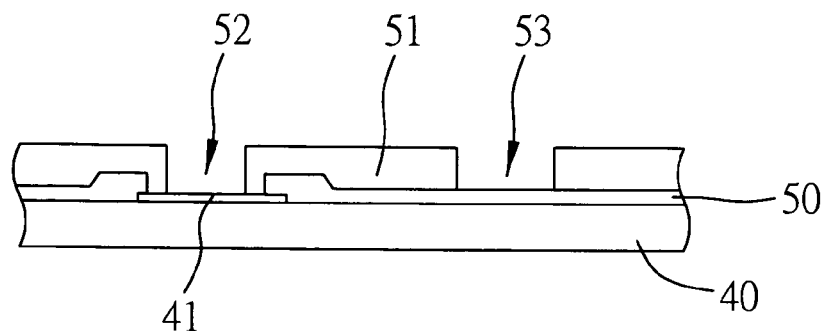
FIG. 2A to 2E are schematic diagrams showing steps of a fabrication method of a semiconductor device according to a first embodiment of the present invention.
Figure 2B:
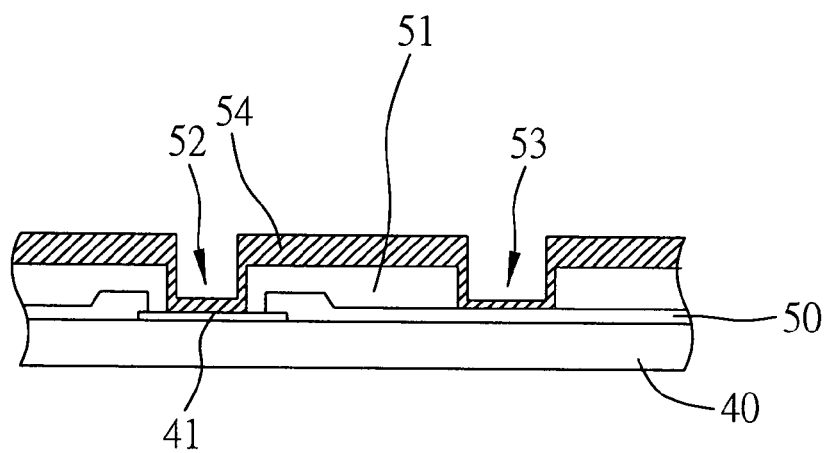
Figure 2C:
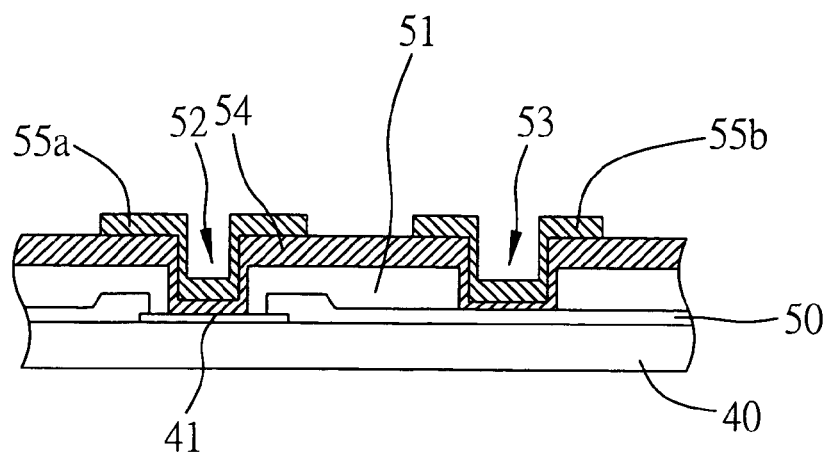
Figure 2D:
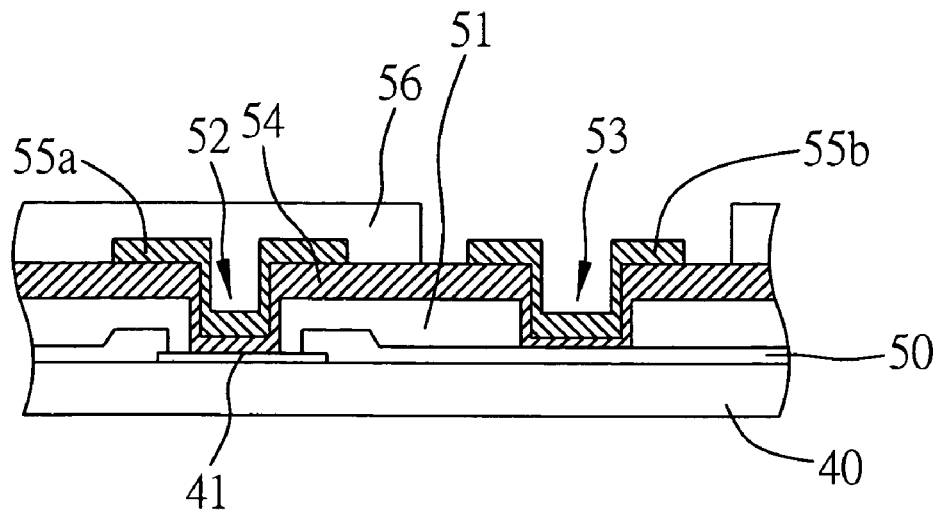
Figure 2E:
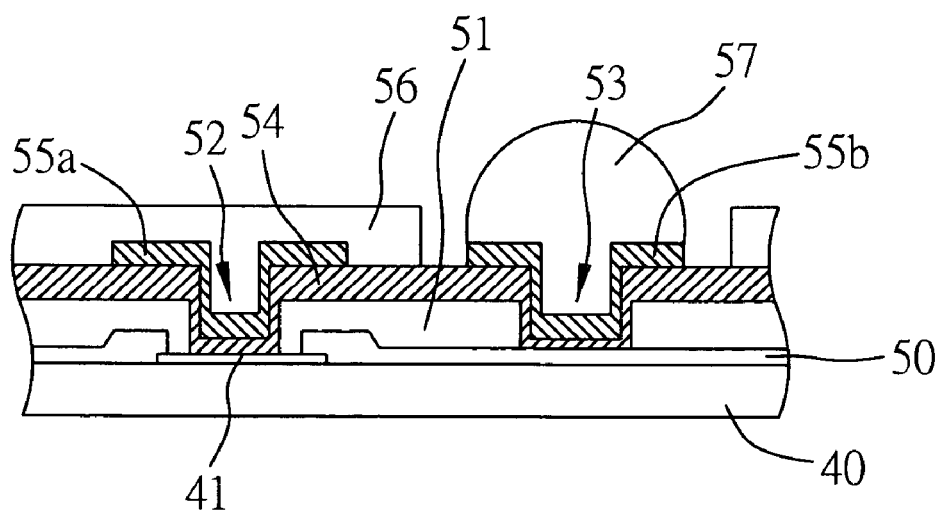

FIG. 2E shows a semiconductor device according to a first embodiment of the present invention. As shown in FIG. 2E, the semiconductor device includes a semiconductor substrate 40, a first dielectric layer 51, a first metallic layer 54, a second metallic layer 55a, a third metallic layer 55b, a second dielectric layer 56, and a solder bump 57.

The semiconductor substrate 40 is primarily made of silicon, such as a semiconductor chip or a wafer including a plurality of chips, wherein at least one bond pad 41 is formed on an active surface of the semiconductor substrate 40. The semiconductor substrate 40 further comprises a passivation layer 50 formed on the active surface thereof, with the bond pad 41 being partially covered by the passivation layer 50. The passivation layer 50 can be made of nitride such as silicon mononitride, and is used to protect the semiconductor substrate 40 and the part of the bond pad 41.

The first dielectric layer 51 is formed on the passivation layer 50 and has a first opening 52 and a second opening 53, wherein the first opening 52 extends vertically through the first dielectric layer 51 to the bond pad 41, and the second opening 53 is located in the first dielectric layer 51 at a predetermined position for redistribution. The first dielectric layer 51 can be made of, but not limited to, benzo-cyclo-butene (BCB), polyimide or silicon dioxide.

The first metallic layer 54 is formed on the first dielectric layer 51 and in the first and second openings 52, 53, wherein the first metallic layer 54 continuously covers a sidewall of the first opening 52, the bond pad 41, and a sidewall and a bottom portion of the second opening 53. The first metallic layer 54 can comprise successive laminated layers of, but not limited to, aluminum, nickel-vanadium alloy, copper or titanium.

The second metallic layer 55a covers the first metallic layer 54 at a position corresponding to the first opening 52 and located on the sidewall of the first opening 52. The second metallic layer 55a is used to assure the electrical quality of the first metallic layer 54 corresponding to the first opening 52 without having an electrical break of the first metallic layer 54 for redistribution, thereby avoiding the prior-art drawback such as damage to a metallic layer for redistribution due to an etching process. Moreover, such arrangement can prevent deterioration of a step coverage effect due to a change of an aspect ratio of the first opening 52 to thereby effectively avoid the electrical break of the first metallic layer 54, such that the present invention is suitably applied to a fine-pitch chip. The second metallic layer 55a can be made of, but not limited to, nickel-vanadium alloy or copper.

The third metallic layer 55b covers the first metallic layer 54 at a position corresponding to the second opening 53 and located on the sidewall of the second opening 53. The third metallic layer 55b is used to assure the electrical quality of the first metallic layer 54 corresponding to the second opening 53 to prevent diffusion and provide a wetting effect for bonding the solder bump 57. The third metallic layer 55b can be made of, but not limited to, nickel-vanadium alloy or copper.

The second dielectric layer 56 covers the first metallic layer 54 and the second metallic layer 55a corresponding to the first opening 52 to protect the first metallic layer 54 and the second metallic layer 55a. The second dielectric layer 56 does not cover the third metallic layer 55b corresponding to the second opening 53. The second dielectric layer 56 can be made of, but not limited to, BCB, polyimide or silicon dioxide.

The solder bump 57 is formed on the third metallic layer 55b not covered by the second dielectric layer 56. The solder bump 57 can be made of tin-lead alloy.

In the semiconductor device of the present invention, the second metallic layer 55a covering the first metallic layer 54 for redistribution can assure the electrical quality of the first metallic layer 54 corresponding to the first opening 52 without having an electrical break of the first metallic layer 54, thereby avoiding the prior-art drawback such as damage to a metallic layer for redistribution due to an etching process. Moreover, the semiconductor device can prevent deterioration of a step coverage effect due to a change of an aspect ratio of the first opening 52 to thereby effectively avoid the electrical break of the first metallic layer 54, such that the present invention is suitably applied to a fine-pitch chip.

FIGS. 2A to 2E show steps of a fabrication method of the semiconductor device according to the first embodiment of the present invention.

Referring to FIG. 2A, firstly, a semiconductor substrate 40 having at least one bond pad 41 is prepared, such as a semiconductor chip or a wafer including a plurality of chips. A passivation layer 50 is formed on the semiconductor substrate 40 and partially covers the bond pad 41. The passivation layer 50 can be made of nitride such as silicon mononitride, and is used to protect the semiconductor substrate 40 and the part of the bond pad 41. Then, a first dielectric layer 51 is applied on the passivation layer 50. The first dielectric layer 51 is formed with a first opening 52 and a second opening 53, wherein the first opening 52 extends vertically through the first dielectric layer 51 to the bond pad 41, and the second opening 53 is located in the first dielectric layer 51 at a predetermined position for redistribution. The first dielectric layer 51 can be made of, but not limited to, BCB, polyimide or silicon dioxide. In the above and subsequent fabrication steps, etching, deposition and/or patterning techniques may be employed, for example for forming the first and second openings 52, 53, which are well-known techniques in the art and thus not to be further detailed herein.

Next, referring to FIG. 2B, a first metallic layer 54 is formed on the first dielectric layer 51 and in the first and second openings 52, 53, wherein the first metallic layer 54 continuously covers a sidewall of the first opening 52, the bond pad 41 and a sidewall and a bottom portion of the second opening 53. The first metallic layer 54 comprises successive laminated layers of, but not limited to, aluminum, nickel-vanadium alloy, copper or titanium.

Then, referring to FIG. 2C, a second metallic layer 55a is formed to cover the first metallic layer 54 at a position corresponding to the first opening 52 and located on the sidewall of the first opening 52. A third metallic layer 55b is formed to cover the first metallic layer 54 at a position corresponding to the second opening 53 and located on the sidewall of the second opening 53. The second metallic layer 55a is used to assure the electrical quality of the first metallic layer 54 corresponding to the first opening 52, thereby preventing deterioration of a step coverage effect due to a change of an aspect ratio of the first opening 52 and avoiding the prior-art drawback such as damage to a metallic layer for redistribution due to an etching process, such that an electrical break of the first metallic layer 54 is effectively avoided and the present invention is suitably applied to a fine-pitch chip. The third metallic layer 55b is used to assure the electrical quality of the first metallic layer 54 corresponding to the second opening 53 to prevent diffusion and provide a wetting effect for subsequently bonding a solder bump. Each of the second and third metallic layers 55a, 55b can be made of, but not limited to, Nickel-vanadium alloy or copper.

Subsequently, referring to FIG. 2D, a second dielectric layer 56 is applied on the first metallic layer 54 and the second metallic layer 55a corresponding to the first opening 52, but does not cover the third metallic layer 55b corresponding to the second opening 53, so as to protect the first metallic layer 54 and the second metallic layer 55a via the second dielectric layer 56. The second dielectric layer 56 can be made of, but not limited to, BCB, polyimide or silicon dioxide.

Finally, referring to FIG. 2E, a solder material such as tin-lead alloy is applied on the third metallic layer 55b not covered by the second dielectric layer 56, and is subjected to a reflow soldering process to form a solder bump 57.

Second Embodiment

Figure 3:
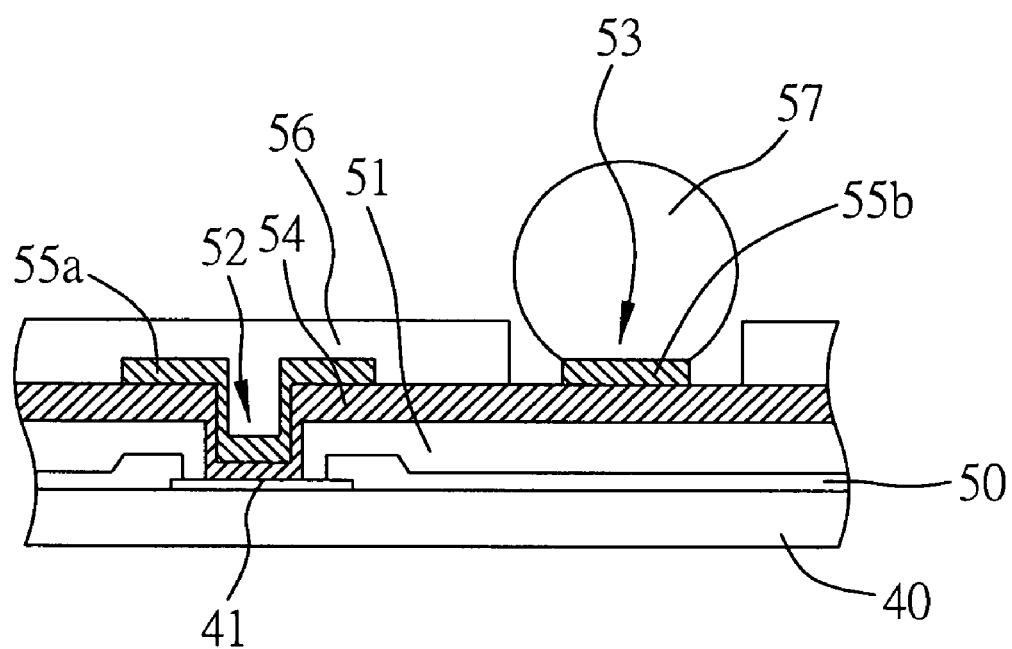
FIG. 3 is a schematic diagram of a semiconductor device according to a second embodiment of the present invention.

FIG. 3 shows a semiconductor device according to a second embodiment of the present invention, which is similar to the semiconductor device in the first embodiment and is fabricated by a method similar to that in the first embodiment. As shown in FIG. 3, the semiconductor device includes a semiconductor substrate 40, a first dielectric layer 51, a first metallic layer 54, a second metallic layer 55a, a third metallic layer 55b, a second dielectric layer 56 and a solder bump 57. The second metallic layer 55a similarly covers the first metallic layer 54 at a position corresponding to the first opening 52 of the first dielectric layer 51 and located on the sidewall of the first opening 52. However, in the second embodiment, the first dielectric layer 51 is not further formed with a second opening corresponding to a predetermined position for redistribution on which the solder bump 57 is bonded. The third metallic layer 55b is similarly formed on the first metallic layer 54 at the predetermined position for redistribution, and the second dielectric layer 56 does not cover the third metallic layer 55b. Therefore, the second metallic layer 55a on the first metallic layer 54 for redistribution can assure the electrical quality of the first metallic layer 54 corresponding to the first opening 52 without having an electrical break of the first metallic layer 54 thereby avoiding the prior-art drawback such as damage to a metallic layer for redistribution due to an etching process.

According to the semiconductor device and the fabrication method thereof in the present invention, since the second metallic layer 55a covers the first metallic layer 54 at a position corresponding to the first opening 52, the electrical quality of the first metallic layer 54 corresponding to the first opening 52 can be assured without having an electrical break of the first metallic layer 54, thereby avoiding the prior-art drawback such as damage to a metallic layer for redistribution due to an etching process. Moreover, the present invention can prevent deterioration of a step coverage effect due to a change of an aspect ratio of the first opening 52 to thereby effectively avoid the electrical break of the first metallic layer 54, such that the present invention is suitably applied to a fine-pitch chip. Furthermore, the first opening 52 and the second opening 53 are concurrently formed in the first dielectric layer 51, such that the first metallic layer 54 and third metallic layer 55b subsequently formed in the second opening 53 may serve as a UBM structure for firmly bonding the solder bump 57.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor device comprising:
    a semiconductor substrate having at least one bond pad;
    a first dielectric layer formed on the semiconductor substrate, wherein the first dielectric layer has a first opening for exposing the bond pad and a second opening at a predetermined position for redistribution;
    a first metallic layer formed on the first dielectric layer and in the first and second openings;
    a second metallic layer and a third metallic layer, which are formed on the first metallic layer at positions corresponding to the first opening and the second opening, respectively, and cover the first metallic layer at positions corresponding to sidewalls of the first and second openings, respectively, the second and third metallic layers being separate from each other;
    a second dielectric layer applied on the first metallic layer and the second metallic layer corresponding to the first opening, wherein the third metallic layer corresponding to the second opening is exposed from the second dielectric layer; and
    a solder bump formed on the third metallic layer.

2. The semiconductor device of claim 1, wherein the semiconductor substrate is one of a semiconductor chip and a wafer.

3. The semiconductor device of claim 1, wherein each of the first and second dielectric layers is made of a material selected from the group consisting of benzo-cyclo-butene (BCB), polyimide and silicon dioxide.

4. The semiconductor device of claim 1, wherein the first metallic layer comprises successive laminated layers of aluminum, nickel-vanadium alloy, copper or titanium.

5. The semiconductor device of claim 1, wherein each of the second and third metallic layers is made of one of nickel-vanadium alloy and copper.

6. The semiconductor device of claim 1, further comprising a passivation layer formed between the semiconductor substrate and the first dielectric layer.

7. The semiconductor device of claim 6, wherein the passivation layer is a silicon mononitride layer.

8. A fabrication method of a semiconductor device, comprising the steps of:
    providing a semiconductor substrate having at least one bond pad;
    forming a first dielectric layer on the semiconductor substrate, wherein the first dielectric layer has a first opening for exposing the bond pad and a second opening at a predetermined position for redistribution;
    forming a first metallic layer on the first dielectric layer and in the first and second openings;
    forming a second metallic layer and a third metallic layer on the first metallic layer at positions corresponding to the first opening and the second opening, respectively, wherein the second and third metallic layers cover the first metallic layer at positions corresponding to sidewalls of the first and second openings, respectively, and are separate from each other;
    applying a second dielectric layer on the first metallic layer and the second metallic layer corresponding to the first opening, wherein the third metallic layer corresponding to the second opening is exposed from the second dielectric layer; and
    forming a solder bump on the third metallic layer.

9. The fabrication method of claim 8, wherein the semiconductor substrate is one of a semiconductor chip and a wafer.

10. The fabrication method of claim 8, wherein each of the first and second dielectric layers is made of a material selected from the group consisting of BCB, polyimide and silicon dioxide.

11. The fabrication method of claim 8, wherein the first metallic layer comprises successive laminated layers of aluminum, nickel-vanadium alloy, copper or titanium.

12. The fabrication method of claim 8, wherein each of the second and third metallic layers is made of one of nickel-vanadium alloy and copper.

13. The fabrication method of claim 8, further comprising forming a passivation layer between the semiconductor substrate and the first dielectric layer.

14. The fabrication method of claim 13, wherein the passivation layer is a silicon mononitride layer.

* * * * *